(12) United States Patent
Nara

(10) Patent No.: US 6,484,111 B1
(45) Date of Patent: Nov. 19, 2002

(54) REAL TIME SIGNAL ANALYZER

(75) Inventor: Akira Nara, Tokyo (JP)

(73) Assignee: Sony/Tektronix Corporation, Tokyo (JP)

( * ) Notice: Subject to any disclaimer, the term of this patent is extended or adjusted under 35 U.S.C. 154(b) by 0 days.

(21) Appl. No.: 09/355,468

(22) PCT Filed: Feb. 2, 1998

(86) PCT No.: PCT/JP98/00431

§ 371 (c)(1),
(2), (4) Date: Jul. 30, 1999

(87) PCT Pub. No.: WO98/36284

PCT Pub. Date: Aug. 20, 1998

(30) Foreign Application Priority Data

Dec. 2, 1997 (JP) ................................. 9-43044

(51) Int. Cl.[7] .................................. G01S 9/00
(52) U.S. Cl. .......................... 702/77; 702/57; 702/106; 702/183; 702/189; 702/197
(58) Field of Search .............................. 702/57, 66, 67, 702/68, 69, 70, 71, 75–80, 106, 108, 110, 117, 118, 124–126, 177, 183, 189, 190, 197, 198, FOR 103, 104, FOR 107–11, FOR 134–135, FOR 155, FOR 164, FOR 168, 17, FOR 171; 324/76.19, 76.21, 76.23, 76.35; 708/300, 311, 400, 403, 404, 405, 506

(56) References Cited

U.S. PATENT DOCUMENTS

| | | | | |
|---|---|---|---|---|
| 4,471,357 A | * | 9/1984 | Wu et al. ................ | 343/5 CM |
| 4,802,098 A | * | 1/1989 | Hansen et al. .......... | 364/487 |
| 5,073,860 A | * | 12/1991 | Blackburn et al. ..... | 364/424.05 |
| 5,301,134 A | * | 4/1994 | Maruyama ............... | 364/724.1 |
| 5,339,264 A | * | 8/1994 | Said et al. ............. | 364/724.16 |

(List continued on next page.)

FOREIGN PATENT DOCUMENTS

| | | | |
|---|---|---|---|
| EP | 0 285 238 | | 10/1988 |
| EP | 0 477 379 | | 4/1992 |
| EP | 0945731 A1 | * | 9/1999 |
| JP | 3-282375 | | 12/1991 |
| JP | 6-11477 | | 3/1994 |
| JP | 6-154222 | | 6/1994 |
| JP | 6-180711 | | 6/1994 |
| JP | WO98/26298 | * | 6/1998 |

Primary Examiner—Marc S. Hoff
Assistant Examiner—Carol S. Tsai
(74) Attorney, Agent, or Firm—Smith-Hill and Bedell

(57) ABSTRACT

This invention relates to a real time signal analyzer that can produce time domain data and frequency domain data at the substantial same time and in real time, securing the simultaneousness between them, and can analyze them with changing the setting of the center frequency and the signal analysis span arbitrarily in low cost configuration. The apparatus has frequency conversion means 14 and 16 for shifting the frequency of input time domain data according to a selectable center frequency data and for decimating them according to a selectable decimation coefficient, a FFT processor 18 for FFT processing the output data of the frequency conversion means in real time, a delay means 28 for delaying the output data of the frequency conversion means for a predetermined time, a frequency domain data memory means 32 for storing the FFT processed frequency domain data from the FFT processor, a time domain data memory means 36 for storing the delayed time domain data read out from the delay means, and feedback means 30 and 38 for feeding the data read out from the time domain data memory means back to the frequency conversion means instead of the input time domain data.

10 Claims, 3 Drawing Sheets

U.S. PATENT DOCUMENTS

| | | | |
|---|---|---|---|
| 5,384,869 A | * 1/1995 | Wilkinson et al. | 382/56 |
| 5,414,568 A | * 5/1995 | Taki et al. | 360/19.1 |
| 5,434,954 A | * 7/1995 | Kawauchi et al. | 395/140 |
| 5,576,978 A | 11/1996 | Kitayoshi | |
| 5,671,168 A | * 9/1997 | Lin et al. | 364/724.18 |
| 5,696,708 A | * 12/1997 | Leung | 364/724.1 |
| 5,757,848 A | * 5/1998 | Hogberg | 375/208 |
| 5,880,980 A | * 3/1999 | Rothacher et al. | 364/724.1 |
| 5,935,199 A | * 8/1999 | Del Signore | 708/313 |
| 5,999,561 A | * 12/1999 | Naden et al. | 375/206 |
| 5,999,575 A | * 12/1999 | Tanaka et al. | 375/329 |
| 6,061,705 A | * 5/2000 | Hellberg | 708/408 |
| 6,173,302 B1 | * 1/2001 | Piirainen | 708/313 |
| 6,359,938 B1 | * 3/2002 | Keevill et al. | 375/316 |

* cited by examiner

REAL TIME SIGNAL ANALYZER

TECHNICAL FIELD

The present invention relates to a signal analyzer that can analyze a signal in real time. More particularly, it relates to a real time signal analyzer that can produce time domain data and frequency domain data at substantially the same time and in real time, securing the coincidence between them, and can analyze them with resetting the center frequency and the signal analysis span arbitrarily in low cost configuration.

BACKGROUND ART

A real time FFT analyzer is a measurement apparatus that continuously transforms a signal under test by the process in real time without dead time in order to extract the frequency domain component from the signal to analyze it. FIG. 2 shows a schematic block diagram of a conventional FFT analyzer that provides such a real time process. An ADC (analog to digital converter) 10 converts a signal under test into a digital signal and then an IQ separator 12 separates it into the I (In-Phase) component and the Q (Quadrature-Phase) component. A digital mixer 14 provides a frequency shift process to the I component data and the Q component data according to a center frequency data and a decimation filter 16 provides a decimation process to these data according to a, selectable decimation coefficient. The decimation coefficient is defined as the ratio of the element number of the input data to that of the output data of the decimation filter 16. The value of the decimation coefficient data is decided depending on the setting of the data analysis span of the analyzer. An FFT processor 18, transforms the decimated time domain data, for example, 1024 points of the time domain data as one frame, into frequency domain data by the FFT. (Fast Fourier Transform) process. The decimation filter 16 has a data buffer (not shown) in the output portion, for sequential storage of one frame of data, and the data are written in this data buffer sequentially and continuously. The FFT processor 18 can complete the FFT process of the previous frame during the storage of the new data into the data buffer that allows the real time FFT analysis of the data. A memory 20 stores the output data of the FFT processor 18 sequentially. A trigger circuit 22 can set a trigger condition to the data in the memory 20. If the trigger condition is satisfied, the trigger circuit 22 outputs a trigger signal to read out the data that qualify the trigger condition from the memory 20. A CPU 24 controls the whole of the real time analyzer. The data read out from the memory 20 are sent to a display circuit (not shown) to display them on a display screen (not shown). This real time FFT analyzer can extract spectrum (or frequency component) data in real time without dead time and can capture an event occurrence that meets an arbitrary trigger condition for record and display.

It is necessary for the described real time FFT analyzer to set a center frequency and a signal analysis span, but it would be difficult to set these condition properly at the beginning if, especially, a signal under test has a transient variation or an incidental fluctuation. In such a case, it is desirable to set a wider analysis span at first and analyze and display the signal, and then to reset the center frequency and the analysis span any analyze the signal again to get a magnified display of a remarkable point of the signal component. Such a process, however, has been realized in a CPU by software before so that it requires plenty of time for the second data analysis and display process. Therefore there was such an attempt as further provides a zoom processor 26 (FIG. 3) specialized for zoom processing in order to make the signal process fast, but this leads the system to a complicate one and then cost up.

Besides, when it conducts the signal analysis and the signal display after changing the center frequency and the analysis span and if the signal is transient or incidental, it is impossible for the conventional signal analyzer as shown in FIGS. 2 and 3 to trace the original event accurately even if it acquires and analyzes the signal again.

Therefore what is desired is to provide a real time signal analyzer that can provide a low cost signal analysis with resetting the center frequency and the analysis span.

What is further desired is to provide a real time signal analyzer that allows any times of resetting of the center frequency and the analysis span even if the signal has a transient variation or an incidental fluctuation.

What is further desired is to provide a real time signal analyzer that produces time and frequency domain data at substantially the same time, having time correspondence and securing the coincidence between them, and can analyze them with resetting the center frequency and the analysis span.

DISCLOSURE OF INVENTION

A real time signal analyzer according to the present invention has a frequency conversion means for decimating input time domain data according to a selectable decimation coefficient, an FFT processor for transforming the output data of the frequency conversion means by the FFT process in real time, a delay means for delaying the output data of the frequency conversion means for a predetermined time, a frequency domain data memory means for storing the FFT processed frequency domain data from the FFT processor, a time domain data memory means for storing the delayed time domain data read out from the delay means, and a feedback means for feeding the data read out from the time domain data memory means back to the frequency conversion means instead of said input time domain data.

The delay means provides a predetermined delay time to the time domain data that makes the frequency domain data in the frequency domain data memory means and the time domain data in the time domain data memory means have time correspondence. It provides a repetitive FFT analysis according to the most suitable center frequency or decimation coefficient by means of feeding the time domain data from the time domain data memory means back to the frequency conversion means.

BEST MODE FOR CARRYING OUT THE INVENTION

Figure 1:
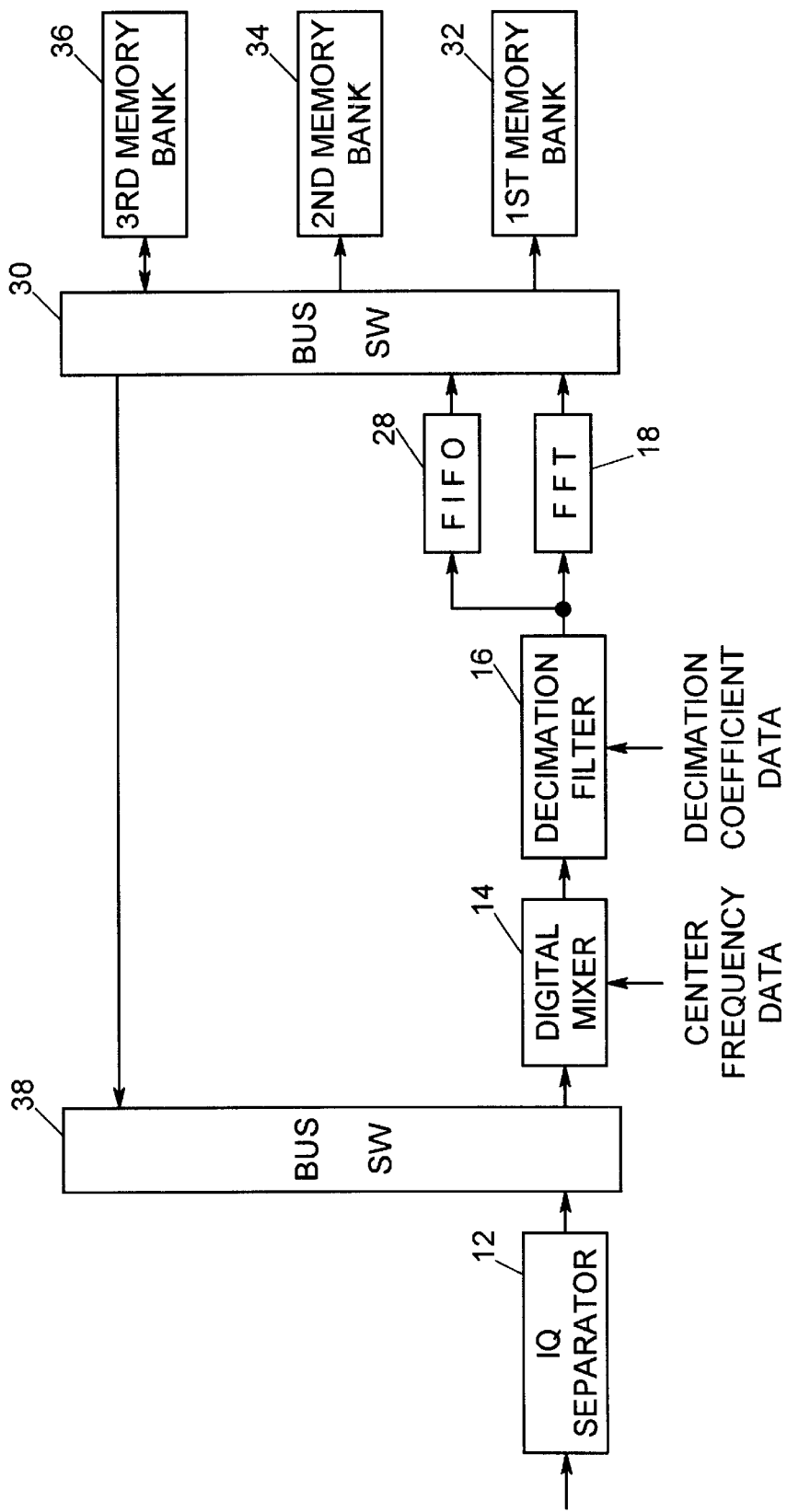
FIG. 1 is a schematic block diagram showing a preferred example embodying the invention.
Figure 2:
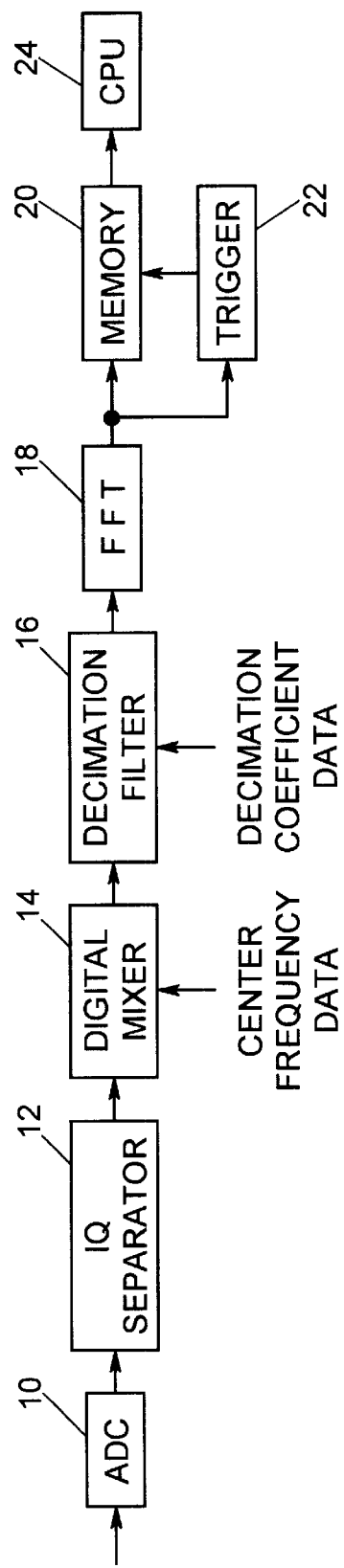
FIG. 2 is a schematic block diagram of an example of a conventional real time FFT analyzer.
Figure 3:
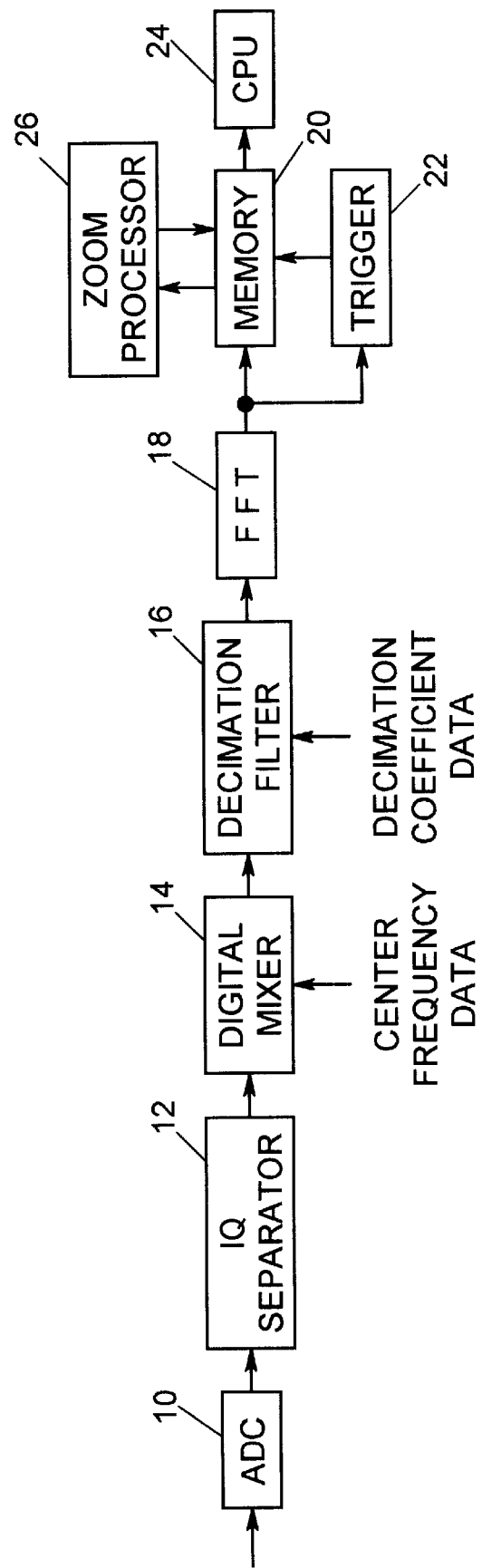
FIG. 3 is a schematic block diagram of an example of another conventional real time FFT analyzer.

FIG. 1 shows a schematic block diagram of a preferred example embodying the present invention. The same reference numbers are assigned to these elements corresponding to those of FIGS. 2 and 3. An IQ separator 12 separates input data of time domain into I and Q components. A bus switch 38 selectively provides the output data of the IQ separator 12 to a digital mixer 14. The digital mixer 14 shifts the frequency of the time domain data according to a center frequency data. A decimation filter 16 decimates the frequency shifted time domain data according to, a selectable decimation coefficient. The decimation coefficient, as described above, is defined as the ratio of the element number of the input data to the element number of the output data of the decimation filter 16 for a predetermined time. For example, if the number of the input data is 1,000 and the number of the output data is 500, the decimation coefficient is 2. The decimation coefficient is decided by the decimation coefficient data according to the setting of the signal analysis span and may be 1 for non-decimation. The clock frequency of the output data of the decimation filter varies over a wide range, for example, from 12.8 MHz to 128 MHz according to the variation of the decimation coefficient. As described, the frequency shift of the digital mixer 14 and the decimation process of the decimation filter 16 provide a frequency conversion of the time domain data and produce, for example, 1024 points of the time domain data as one frame in real time. This number of the data points of the one frame is just an example and would be arbitrary value according to the specification of the data display or the analysis function. An FFT processor 18 transforms the time domain data by the FFT process and, at the same time, multiplies it by the window function if necessary. The time domain data of the output data of the decimation filter 16 is also provided to a FIFO (First In First Out) memory 28. The FIFO memory 28 is a means for delaying the time domain data for the time corresponding to that necessary for the FFT process.

The output data of the FFT processor 18 are the frequency domain data showing the spectrum component of the signal under test. On the other hand, the delayed time domain data output from the FIFO 28 are delayed by a time equal to the FFT processing time of the FFT processor 18. Therefore the time domain data and the frequency domain data correspond in time and with certainty are synchronized with each other. Then it is easy to compare them each other, for example, to compare and watch how the time domain data and the frequency data change in accordance with the transient variation or incidental fluctuation of the signal under test by means of displaying their waveforms on a screen at the same time.

The first, second and third memory banks 32, 34 and 36 store the frequency domain data and the time domain data respectively provided from the FFT processor 18 and the FIFO 28 according to the setting of a bus switch 30. At first, if the decimation coefficient is 1, the frequency domain data output from the FFT processor 18 is stored in the first and second memory banks 32 and 34. Each of the first and second memory banks 32 and 34 could have a memory capacity of 1,000 frames. On the other hand, the time domain data output from the FIFO 28 is stored in the third memory bank 36 via the bus switch 30. The third memory bank 36 could have a memory capacity of 2,000 frames. Therefore the frequency domain data and the time domain data stored in the first, second and third memory banks could reach to a total of 2,000 frames. These data make it possible to display the frequency domain waveform and the time domain waveform on a display screen (not shown) to watch them as a first analysis display. The display screen could be any display means such as a cathode-ray tube, a liquid crystal display and so on. Besides, a printer or a plotter etc. may be connected to output the analyzed data on paper media if necessary.

As described above, the frequency domain data stored in the first and second memory banks 32 and 34, and the time domain data stored in the third memory bank 36 correspond in time, or are synchronized each other. Then it is easy to compare them, for example, to compare and watch how the time domain data and the frequency domain data change in accordance with the transient variation or the incidental fluctuation of the signal under test by means of displaying both waveforms on the screen at the same time. Besides, these of the frequency domain data and the time domain data are such a data as are acquired continuously, or without "dead time". Therefore the data certainly reflect the transient variation and the incidental fluctuation of the signal under test.

This invention can provide a suitable magnified display according to an arbitrary setting of the center frequency and the analysis span in low cost configuration because it recycles the time domain data stored in the third memory bank 36. If an operator changes the setting of the center frequency and the analysis span of the frequency domain for a magnified display of a portion in the first analysis display it changes the center frequency data and the decimation coefficient data according to the setting. The time domain data read out from the third memory bank 36 are fed back to the input of the digital mixer 14 through the bus switches 30 and 38. At this time, the bus switch 38 cuts off the input data from the IQ separator 12. Therefore the digital mixer 14 shifts the frequency according to the new center frequency, and the decimation filter 16 conducts the decimation process according to the new decimation coefficient (2 or over). Then the output data of the decimation filter 16 is transformed by the FFT process to provide the frequency data for the magnified display. Besides, the FIFO 28 outputs the time domain data that have the time correspondence to the frequency domain data for the magnified display. At this time, the bus switch 30 makes the first memory bank 32 store the frequency domain data output from the FFT processor 18 and the second memory bank 34 store the time domain data output from the FIFO 28. This configuration, however, rewrites and deletes the original, or the first stored frequency domain data in the first and second memory banks 32 and 34 so that if it is desired to keep the original frequency domain data, another memory may be provided to move them thereto. Anyway, since the third memory bank 36 stores the original time domain data as it is, the operator watches the frequency domain waveform displayed on the display screen (not shown), and selects another setting of the center frequency or the analysis span to produce more suitable magnified display again.

Though this invention has been described above according to a preferred example, it would be apparent for the skilled in the art to modify it in various ways. For example, though the second memory bank 34 is used as a means for selectively storing the frequency domain data or the time domain data in the above example, different special memories may be provided for the respective data. The first acquired frequency and time domain data may be always kept by providing such different memories as one memory stores the first frequency and time domain data and another memory stores the frequency and time domain data newly acquired according to a new magnified setting of the center frequency and the signal analysis span. Each of memories may be independent or a multi-port memory may be used. As described, an engineer could choice any physical configuration or usage of the memory for the convenience.

INDUSTRIAL APPLICABILITY

A real time signal analyzer according to the present invention that can produce time domain data and frequency domain data at the substantial same time and in real time, securing the simultaneousness between them. Besides, it can repetitively analyze the stored time domain data in various settings. Therefore it can produce the most suitable analysis data with changing the setting of the center frequency and the signal analysis span any number of times even if the signal has a transient variation or an incidental fluctuation. It could be realized at low cost in slight modified configuration without a special processor. It requires no software processing and provides hardware high-speed analysis so that it is highly useful for analysis of both of the time domain data and the frequency domain data.

What is claimed is:

1. A real time signal analyzer for receiving input time domain data, comprising:

a frequency conversion means for shifting the frequency of time domain data according to a selectable center frequency data, and for decimating the time domain data according to a selectable decimation coefficient;

an FFT processor for FFT processing the output data of the frequency conversion means in real time;

a delay means for delaying the output data of the frequency conversion means for a predetermined time;

a frequency domain data memory means for storing the FFT processed frequency domain data from the FFT processor;

a time domain data memory means for storing the delayed time domain data read out from the delay means; and a selector means operable either for supplying the input time domain data to the frequency conversion means or for reading data out from the time domain memory means and feeding the data read out from the time domain data memory means back to the frequency conversion means.

2. A real time signal analyzer according to claim 1, wherein the delay means sets up the delay time corresponding to the processing time of the FFT processor.

3. A real time signal analyzer comprising:

a frequency conversion means for shifting the frequency of input time domain data according to a first selectable center frequency and for decimating the input time domain data according to a first selectable decimation coefficient;

an FFT processor for FFT processing the output data of the frequency conversion means in real time;

a delay means for delaying the output data of the frequency conversion means for a predetermined time;

a frequency domain data memory means for storing the FFT processed frequency domain data from the FFT processor;

a time domain data memory means for storing the delayed time domain data read out from the delay means; and a feedback means for feeding the data read out from the time domain data memory means back to the frequency conversion means instead of the input time domain data;

wherein the frequency conversion means shifts the frequency of the time domain data from the feedback means according to a second center frequency and decimates them according to a second decimation coefficient.

4. A real time signal analyzer according to claim 3, wherein the delay means sets up the delay time corresponding to the processing time of the FFT processor.

5. A real time signal analyzer according to claim 3, wherein the feedback means has a select means for selecting the input time domain data or the data read out from the time domain data memory means.

6. A real time signal analyzer according to claim 1, wherein the frequency conversion means decimates the time domain data from the feedback means according to a decimation coefficient that is larger than the former one.

7. A real time signal analyzer according to claim 3, further comprising:

an analog to digital converter for converting an analog input signal to a digital signal;

an IQ separator for producing the input time domain data by separating the output digital signal of the analog to digital converter into the I and Q components.

8. A real time signal analyzer according to claim 3, wherein the frequency conversion means has a digital mixer for shifting the frequency of the input time domain data according to a selectable center frequency data, and a decimation filter for decimating the output data of the digital mixer according to a selectable decimation coefficient.

9. A real time signal analyzer according to claim 3, wherein the time domain data memory means stores the delayed time domain data in case of the second center frequency data and the second decimation coefficient independent of those in case of the first center frequency data and the first decimation coefficient.

10. A method of analyzing time domain data comprising:

shifting the frequency of time domain data according to a selectable center frequency data, decimating the time domain data according to a selectable decimation coefficient, executing a real time FFT process on the decimated time domain data and generating frequency domain data corresponding to the decimated time domain data, storing the decimated time domain data in a time domain data memory, storing the frequency domain data in a frequency domain data memory, reading the stored time domain data and the stored frequency domain data, whereby the frequency domain data and the time domain data can be compared, and wherein the time domain data that is read from the time domain data memory corresponds to the frequency domain data.

* * * * *